United States Patent
Hsu et al.

(10) Patent No.: US 11,644,913 B2
(45) Date of Patent: May 9, 2023

(54) TOUCH DISPLAY DEVICE INCLUDING BUFFER LAYER FOR ACCURACY OF TOUCH SENSING

(71) Applicant: HANNSTAR DISPLAY CORPORATION, Taipei (TW)

(72) Inventors: Tzung-Hsien Hsu, Tainan (TW); Chih-Wei Chen, Tainan (TW); Mei-Ling Chou, Tainan (TW); Chia-Yu Liu, Tainan (TW); Yao-Chih Chuang, Tainan (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 0 days.

(21) Appl. No.: 17/229,885

(22) Filed: Apr. 14, 2021

(65) Prior Publication Data
US 2021/0357058 A1 Nov. 18, 2021

(30) Foreign Application Priority Data
May 14, 2020 (CN) .......................... 202010407212.7

(51) Int. Cl.
| | |
|---|---|
| *G06F 3/041* | (2006.01) |
| *G02F 1/1333* | (2006.01) |
| *H01L 27/15* | (2006.01) |
| *H10K 59/40* | (2023.01) |
| *H10K 59/38* | (2023.01) |
| *G02F 1/1335* | (2006.01) |
| *H01L 27/32* | (2006.01) |

(52) U.S. Cl.
CPC ........ *G06F 3/0412* (2013.01); *G02F 1/13338* (2013.01); *G02F 1/133302* (2021.01); *G02F 1/133519* (2021.01); *H01L 27/15* (2013.01); *H01L 27/322* (2013.01); *H01L 27/323* (2013.01)

(58) Field of Classification Search
CPC combination set(s) only.
See application file for complete search history.

(56) References Cited

FOREIGN PATENT DOCUMENTS

| CN | 10-1611112 | * | 2/2007 | ............ C09J 133/00 |
|---|---|---|---|---|
| CN | 20-3720825 | * | 7/2014 | ............ G06F 3/041 |
| CN | 10-4246667 | * | 12/2014 | ............ G06F 3/041 |

* cited by examiner

*Primary Examiner* — Lauren Nguyen
(74) *Attorney, Agent, or Firm* — Winston Hsu

(57) ABSTRACT

A touch display device includes a display panel, a conductive layer, an optical matching layer and a buffer layer. The display panel comprises a first substrate, a second substrate and a display medium layer. The first substrate comprises a first surface and a second surface, the second substrate is disposed opposite to the first substrate, and the display medium layer is disposed between the second surface of the first substrate and the second substrate. The conductive layer is disposed on the first surface of the first substrate, and comprises a plurality of sensing electrodes. The optical matching layer is disposed between the conductive layer and the first surface of the first substrate. The buffer layer with a thickness greater than or equal to 50 Å and less than or equal to 3000 Å is disposed between the optical matching layer and the first surface of the first substrate.

8 Claims, 2 Drawing Sheets

TOUCH DISPLAY DEVICE INCLUDING BUFFER LAYER FOR ACCURACY OF TOUCH SENSING

BACKGROUND OF THE INVENTION

1. Field of the Invention

The present invention relates to a touch display device, more particularly to a touch display device capable of avoiding the decrease of the accuracy of the touch sensing.

2. Description of the Prior Art

Touch display devices have been widely used in various kinds of electronic products, such that the users may directly communicate with the electronic products, and conventional input devices such as the keyboard or the mouse may be replaced to reduce the size of the electronic product and improve the convenience of human-machine communication. The current touch display devices have not yet met the demands of the users in all aspects, for example, there are still some problems with the accuracy of touch sensing. Therefore, making the touch sensing of touch display devices with high accuracy is a project that needs to be continuously improved.

SUMMARY OF THE INVENTION

The technical problem to be solved by the present invention is to avoid the decrease of accuracy of touch sensing of the touch display device.

In order to solve the above-mentioned technical problem, a touch display device including a display panel, a conductive layer, an optical matching layer and a buffer layer is provided by the present invention. The display panel includes a first substrate, a second substrate and a display medium layer. The first substrate includes a first surface and a second surface, the second substrate is disposed opposite to the first substrate, and the display medium layer is disposed between the second surface of the first substrate and the second substrate. The conductive layer is disposed on the first surface of the first substrate, and the conductive layer includes a plurality of sensing electrodes. The optical matching layer is disposed between the conductive layer and the first surface of the first substrate. The buffer layer is disposed between the optical matching layer and the first surface of the first substrate, and a thickness of the buffer layer is greater than or equal to 50 angstroms (Å) and less than or equal to 3000 Å.

In the touch display device of the present invention, a buffer layer may be disposed between the optical matching layer and the first substrate to avoid the interaction between the optical matching layer and the first substrate, and the increase of the conductivity of the optical matching layer and the decrease of the resistance between adjacent sensing electrode strings in the conductive layer due to the increase of the conductivity of the layer below may be avoided, thereby avoiding the decrease of accuracy of touch sensing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
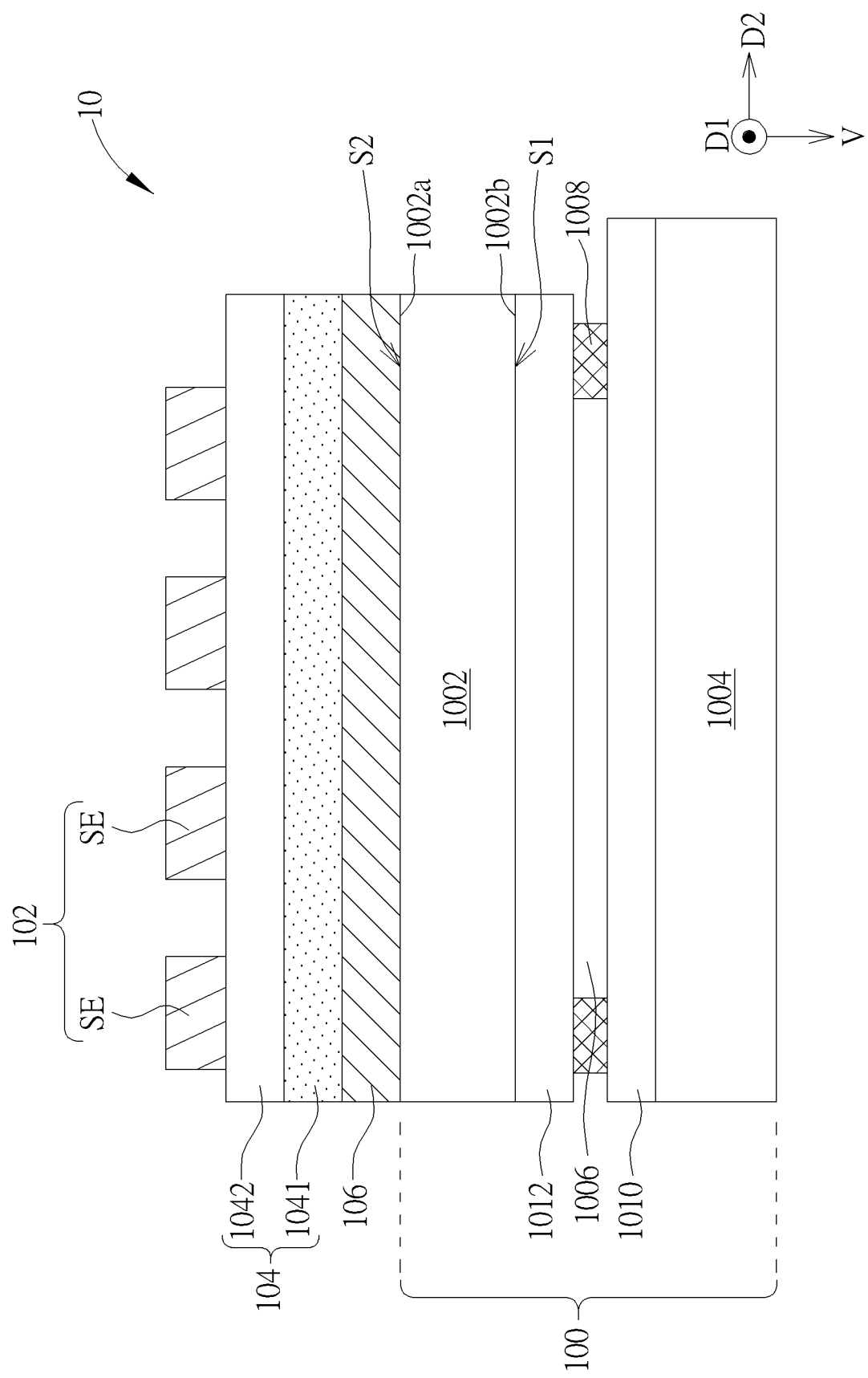
FIG. 1 schematically illustrates a cross-sectional view of a touch display device according to the present invention.

In order to enable those skilled in the art to further understand the present invention, the preferred embodiments of the present invention are specifically described below, taken in junction with the drawings to detail the contents and the desired effects of the present invention. It should be noted that the drawings are simplified schematic diagrams, and only the components and combinations related to the present invention are shown to provide a clearer description of the basic structure or implementation method of the present invention, and the actual components and layout may be more complex. In addition, for ease of explanation, the components shown in the drawings may not represent their actual number, shape, and dimensions; details can be adjusted according to design requirements.

Figure 2:
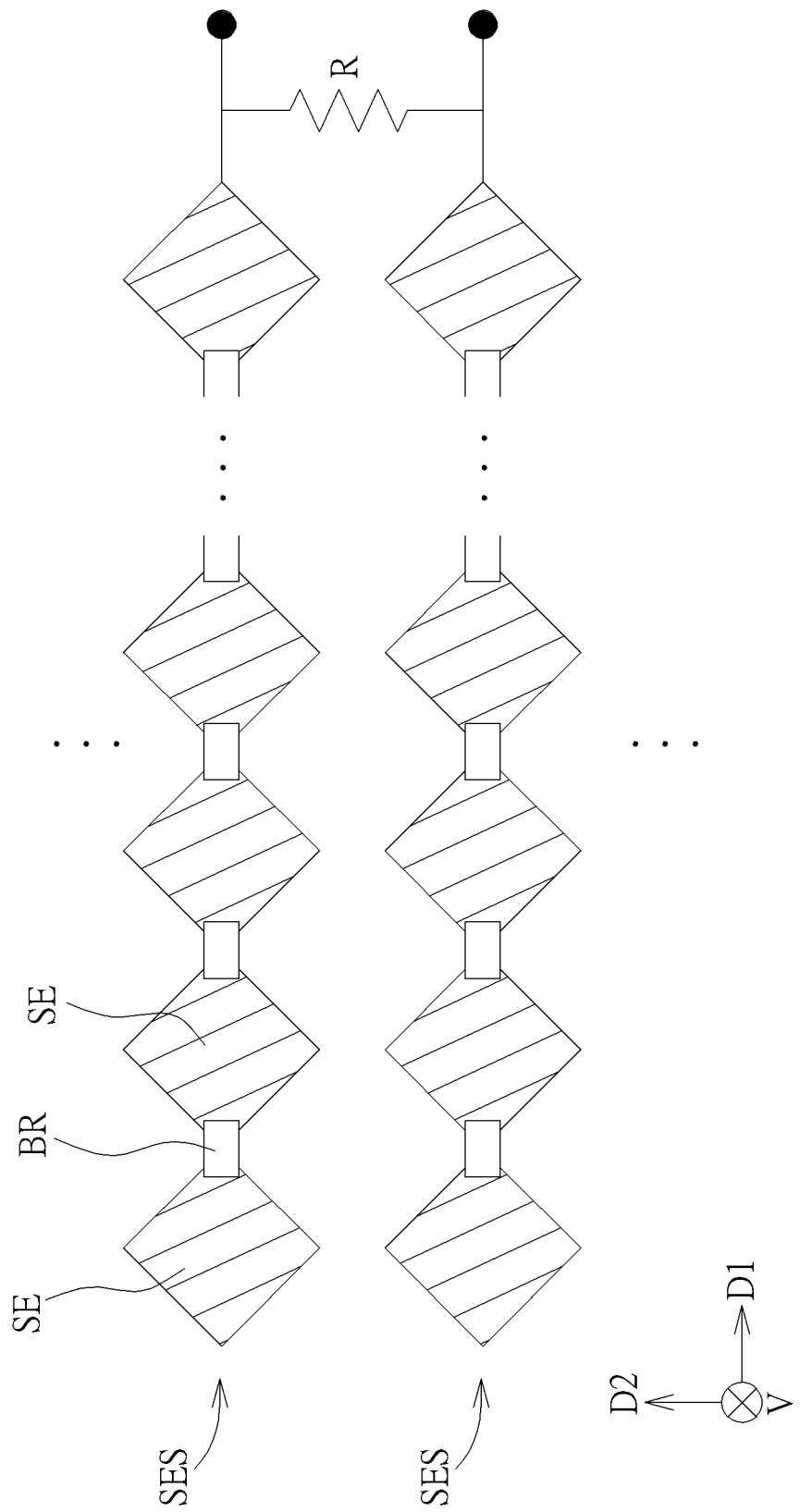
FIG. 2 schematically illustrates a top view of sensing electrodes of the touch display device according to the present invention.

Referring to FIG. 1 and FIG. 2, FIG. 1 schematically illustrates a cross-sectional view of a touch display device according to the present invention, and FIG. 2 schematically illustrates a top view of sensing electrodes of the touch display device according to the present invention. The touch display device 10 of the present embodiment may include a display panel 100, a conductive layer 102, an optical matching layer 104 and a buffer layer 106, but not limited thereto. The display panel 100 may for example include various suitable types of display panels. For example, the display panel 100 may be a self-emissive display panel or a non-self-emissive display panel. The self-emissive display panel may include organic light emitting diode (OLED) display panel or light emitting diode (LED) display panel, but not limited thereto. The non-self-emissive display panel may include liquid crystal display panel (LCD), but not limited thereto. The liquid crystal display panel is taken as an example of the display panel 100 in the present embodiment for description, but not limited thereto.

The display panel 100 may include a first substrate 1002, a second substrate 1004 and a display medium layer 1006. The second substrate 1004 is disposed opposite to the first substrate 1002, and the display medium layer 1006 may be disposed between the first substrate 1002 and the second substrate 1004. The first substrate 1002 may include a first surface 1002a and a second surface 1002b opposite to each other, wherein the first surface 1002a may be farther away from the second substrate 1004, and the second surface 1002b may be closer to the second substrate 1004. In addition, the display medium layer 1006 may be disposed between the second surface 1002b of the first substrate 1002 and the second substrate 1004.

In the present embodiment, the first substrate 1002 may be a rigid substrate (such as a glass substrate), and the material of the first substrate 1002 may include aluminum silicate, but not limited thereto. The second substrate 1004 may be a rigid substrate (such as glass substrate), a plastic substrate, a quartz substrate or a sapphire substrate, and may also be a flexible substrate including polyimide (PI) or polyethylene terephthalate (PET), but not limited thereto.

The display panel 100 of the present embodiment may be a liquid crystal display panel, and the display medium layer 1006 may be a liquid crystal layer, but not limited thereto. In addition, the display panel 100 of the present embodiment may include a sealant 1008 disposed at the periphery of the liquid crystal layer (the display medium layer 1006 shown in FIG. 1), but not limited thereto.

In some embodiments, the display panel 100 may be an organic light emitting diode display panel, and the display medium layer 1006 may be an organic light emitting diode element layer including an organic light emitting layer. The organic light emitting diode element layer may include a stacked structure, for example, the organic light emitting diode element layer may include a hole transporting layer, an organic light emitting layer and an electron transporting layer, but not limited thereto.

In some embodiments, the display panel 100 may be an inorganic light emitting diode display panel such as a micro light emitting diode (micro-LED) display panel, but not limited thereto. In such condition, the display medium layer 1006 may be an inorganic light emitting diode element layer including a p-n diode layer. For example, the p-n diode layer may include a p-doped layer and a n-doped layer. In addition, the p-n diode layer may further include at least one quantum well layer disposed between the p-doped layer and the n-doped layer in some embodiments, but not limited thereto.

In the present embodiment, the display panel 100 may include a transistor layer 1010 disposed between the second substrate 1004 and the display medium layer 1006, but not limited thereto. The transistor layer 1010 may include a plurality of thin film transistors. The thin film transistors may be top gate thin film transistors or bottom gate thin film transistors, and the thin film transistors may be amorphous silicon thin film transistors, low temperature polysilicon (LTPS) thin film transistors, indium gallium zinc oxide (IGZO) thin film transistors or other suitable thin film transistors, but not limited thereto.

In the present embodiment, the gate lines, the data lines, the pixel electrodes, the common electrode, the alignment layer or the combinations thereof may be disposed between the second substrate 1004 and the display medium layer 1006, but not limited thereto. In some embodiments, the common electrode may selectively be disposed between the first substrate 1002 and the display medium layer 1006, but not limited thereto. In order to simplify the figures, the thin film transistors, the gate lines, the data lines, the pixel electrodes, the common electrode and the alignment layer are not drawn in FIG. 1 and will not be redundantly described herein since they are commonly used in this field.

In the present embodiment, the display panel 100 may include a color filter layer 1012 disposed on the first substrate 1002 and located between the first substrate 1002 and the display medium layer 1006, but not limited thereto. The color filter layer 1012 may include materials (such as organic materials, quantum dot materials, etc.) for converting a light to another light with different colors (or wavelengths), but not limited thereto. In another aspect, the color filter layer 1012 may include red light filtering units, blue light filtering units and/or green light filtering units, but not limited thereto. In the present embodiment, the blocking layer (or black matrix layer), the electrode, the alignment layer or the combinations thereof may be disposed between the first substrate 1002 and the display medium layer 1006, but not limited thereto. In order to simplify the figures, the light filtering units, the blocking layer, the electrode and the alignment layer are not drawn in FIG. 1 and will not be redundantly described herein since they are commonly used in this field.

In some embodiments, the display panel 100 may include color filter on array (COA) structure and/or black matrix on array (BOA) structure, and the color filter layer and/or the blocking layer may be disposed between the second substrate 1004 and the display medium layer 1006, but not limited thereto.

In the present embodiment, the touch display device 10 may be an on-cell touch display device, and a touch element layer may be disposed on the first surface 1002a of the first substrate 1002. As shown in FIG. 1, the conductive layer 102 may be a portion of the touch element layer and may be used to represent the location of the touch element layer of the present embodiment. The conductive layer 102 may be disposed on the first surface 1002a of the first substrate 1002, and the conductive layer 102 may include a plurality of sensing electrodes SE. The material of the conductive layer 102 may include transparent conductive materials such as indium tin oxide (ITO), indium zinc oxide (IZO) or aluminum zinc oxide (AZO), but not limited thereto.

As shown in FIG. 2, it may for example be a schematic diagram of the sensing electrodes SE on the first surface 1002a of the first substrate 1002 observed along a top view direction V, and the top view direction V may be perpendicular to the first surface 1002a, but not limited thereto. As shown in FIG. 2, the sensing electrodes SE and the bridge lines BR may form a plurality of sensing electrode strings SES extending along a first direction D1. In the present embodiment, two adjacent sensing electrodes SE may be connected to each other through a bridge line BR or a plurality of bridge lines BR, but not limited thereto. In some embodiments, the touch display device 10 may further include a plurality of sensing electrode strings (not shown) extending along a second direction D2, but not limited thereto. For example, the first direction D1 may be perpendicular to the second direction D2, and the top view direction V may be perpendicular to the first direction D1 and the second direction D2, but not limited thereto.

The optical matching layer 104 may be disposed between the conductive layer 102 and the first surface 1002a of the first substrate 1002. Since the material of the sensing electrodes SE disposed in the display region may be transparent conductive materials (such as ITO), the color of the sensing electrodes SE presented may be different from the color of the peripheral region of the touch display device 10. Therefore, when the touch display device 10 does not display images, users may notice the phenomenon that the color of the display region and the color of the peripheral region are inconsistent, or the sensing electrodes SE in the display region may be observed. However, the optical matching layer 104 may be used to reduce the phenomenon that the color of the display region and the color of the peripheral region are inconsistent.

In the present embodiment, the optical matching layer 104 may include a multi-layer stacked structure, and a thickness of the optical matching layer 104 may be greater than or equal to 100 angstrom (Å) and less than or equal to 1000 Å, but not limited thereto. For example, the optical matching layer 104 may include a first sub-layer 1041 and a second sub-layer 1042, and the second sub-layer 1042 may be disposed on the first sub-layer 1041, but the number of the sub-layers in the optical matching layer 104 is not limited thereto. In the present embodiment, the first sub-layer 1041 may include materials with high refractive index, and the second sub-layer 1042 may include materials with low refractive index, such that the refractive index of the first sub-layer 1041 may be greater than the refractive index of the second sub-layer 1042, but not limited thereto. The material of the first sub-layer 1041 may include niobium pentoxide, titanium dioxide or aluminum oxide, but not limited thereto. The material of the second sub-layer 1042 may include silicon dioxide, but not limited thereto. For example, a thickness of the first sub-layer 1041 may be greater than or equal to 50 Å and less than or equal to 500 Å, and a thickness of the second sub-layer 1042 may be greater than or equal to 50 Å and less than or equal to 1000 Å, but not limited thereto.

The buffer layer 106 may be disposed between the optical matching layer 104 and the first surface 1002a of the first substrate 1002, and the first sub-layer 1041 of the optical matching layer 104 may be disposed between the buffer layer 106 and the second sub-layer 1042. Therefore, in the present embodiment (as shown in FIG. 1), the color filter layer 1012 may be disposed on a side S1 of the first substrate 1002, and the buffer layer 106, the optical matching layer 104 and the conductive layer 102 may be disposed on another side S2 of the first substrate 1002, but not limited thereto. In addition, the buffer layer 106 may include materials with low activity such as silicon dioxide, but not limited thereto. One of the advantages of using silicon dioxide as the material of the buffer layer 106 is that the introduced buffer layer 106 has little effect on the optical properties of the touch display device 10 since the buffer layer 106 is disposed on the first substrate 1002 and the material of the buffer layer 106 and the material of the first substrate 1002 both include silicon. Therefore, the variation in the optical properties of the touch display device 10 brought by the introduction of the buffer layer 106 can be suppressed. In addition, a thickness of the buffer layer 106 may be greater than or equal to 50 Å and less than or equal to 3000 Å in the present embodiment, but not limited thereto.

The technical problems which can be solved by the buffer layer 106 of the present embodiment will be detailed in the following. The material of the first substrate 1002 has broken bonds on the surface (such as the first surface 1002a) of the first substrate 1002. Therefore, when the material of the first substrate 1002 includes aluminum silicate, the aluminum ions located on the first surface 1002a fail to be bonded with a sufficient number of oxygen atoms. When the buffer layer 106 is not included in the touch display device 10, the first surface 1002a of the first substrate 1002 may directly be in contact with the first sub-layer 1041, and if niobium pentoxide is taken as an example of the material of the first sub-layer 1041, the oxygen atoms in the first sub-layer 1041 may tend to be bonded with the aluminum ions in the first substrate 1002, such that the molecular formula of niobium oxide in the first sub-layer may become Nb2Ox, and the number x may be less than 5. When the number x in the molecular formula Nb2Ox is less than 5, the conductivity of Nb2Ox would be increased and be greater than the conductivity of Nb2O5, such that the conductivity of the first sub-layer 1041 and the entire conductivity of the optical matching layer 104 would be increased.

In addition, in the fabrication process of the present embodiment, the layers such as the optical matching layer 104 and the conductive layer 102 may be formed on the side S2 of the first substrate 1002 at first, and then the layers such as the color filter layer 1012 and the blocking layer (or black matrix layer) may be formed on another side S1 of the first substrate 1002. Therefore, multiple processes would be performed after the optical matching layer 104 is formed, and the heating steps in these processes may provide energy, such that the oxygen atoms in the first sub-layer 1041 of the optical matching layer 104 may be bonded with the aluminum ions in the first substrate 1002, thereby improving the conductivity of the first sub-layer 1041 and the entire conductivity of the optical matching layer 104.

After the conductivity of the optical matching layer 104 is increased, the current in the sensing electrode SE may possibly pass through the optical matching layer 104. Therefore, when the buffer layer 106 is not included in the touch display device 10, the resistance R (as shown in FIG. 2) between two adjacent sensing electrode strings SES would be decreased to between 700 kilo ohm (700 KΩ) and 5 mega ohm (5MΩ) since the entire conductivity of the optical matching layer 104 is increased. In addition, the decrease of the resistance R between adjacent sensing electrode strings SES may cause the decrease of accuracy of touch sensing.

However, in the present embodiment, the buffer layer 106 may be disposed between the first sub-layer 1041 of the optical matching layer 104 and the first surface 1002a of the first substrate 1002, and the buffer layer 106 may include materials with low activity (such as silicon dioxide). Therefore, the first surface 1002a of the first substrate 1002 would not directly be in contact with the first sub-layer 1041, and the formation of bonding between oxygen atoms in the first sub-layer 1041 and aluminum ions in the first substrate 1002 may be avoided. In addition, the strength of the bonding between oxygen and silicon in silicon dioxide is stronger, even though the first surface 1002a of the first substrate 1002 is directly in contact with the buffer layer 106, the oxygen in silicon dioxide does not easily form bonding with aluminum ions in the first substrate 1002. Therefore, the decrease of the resistance R between adjacent sensing electrode strings SES due to the increase of the conductivity of the layer below may be avoided through disposing the buffer layer 106. For example, when the touch display device 10 includes the buffer layer 106, the resistance R (as shown in FIG. 2) between two adjacent sensing electrode strings SES may be greater than 20 mega ohm, thereby avoiding the decrease of accuracy of touch sensing.

In another aspect, even though the layers such as the optical matching layer 104 and the conductive layer 102 are formed on the side S2 of the first substrate 1002 at first, and then the layers such as the color filter layer 1012 and the blocking layer (or black matrix layer) are formed on another side S1 of the first substrate 1002, the heating steps performed after the optical matching layer 104 is formed may not easily drive the oxygen in silicon dioxide to be bonded with aluminum ions in the first substrate 1002 because the bonding between oxygen and silicon in silicon dioxide is strong enough, and the decrease of the resistance R between adjacent sensing electrode strings SES in the conductive layer 102 due to the increase of the conductivity of the layer below may thereby be avoided.

In summary, in the touch display device of the present invention, the buffer layer may be disposed between the optical matching layer and the first substrate to avoid the interaction between the optical matching layer and the first substrate, the increase of the conductivity of the optical matching layer may be avoided, and the decrease of the resistance between adjacent sensing electrode strings in the conductive layer due to the increase of the conductivity of the layer below may be avoided, thereby avoiding the decrease of accuracy of touch sensing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A touch display device, comprising:
   a display panel, comprising:

a first substrate including a first surface and a second surface;

a second substrate disposed opposite to the first substrate;

a display medium layer disposed between the second surface of the first substrate and the second substrate; and a color filter layer disposed between the second surface of the first substrate and the display medium layer;

a conductive layer disposed on the first surface of the first substrate, wherein the first substrate is disposed between the conductive layer and the second substrate, and the conductive layer comprises a plurality of sensing electrodes;

an optical matching layer disposed between the conductive layer and the first surface of the first substrate, wherein the optical matching layer includes a flat surface, and the plurality of sensing electrodes are disposed on the flat surface; and a buffer layer disposed between the optical matching layer and the first surface of the first substrate, wherein a thickness of the buffer layer is greater than or equal to 50 Å and less than or equal to 3000 Å, the buffer layer directly contacts the first surface of the first substrate, and a material of the buffer layer comprises silicon dioxide, wherein the first substrate comprises a first side and a second side opposite to the first side, the conductive layer, the optical matching layer and the buffer layer are disposed on the first side of the first substrate, and the color filter layer and the display medium layer are disposed on the second side of the first substrate, wherein the optical matching layer is directly contacted with the plurality of sensing electrodes and the buffer layer.

2. The touch display device of claim 1, wherein a thickness of the optical matching layer is greater than or equal to 100 Å and less than or equal to 1000 Å.

3. The touch display device of claim 1, wherein the optical matching layer comprises a first sub-layer and a second sub-layer, the first sub-layer is disposed between the buffer layer and the second sub-layer, and a refractive index of the first sub-layer is greater than a refractive index of the second sub-layer.

4. The touch display device of claim 3, wherein a material of the first sub-layer comprises niobium pentoxide.

5. The touch display device of claim 3, wherein a material of the second sub-layer comprises silicon dioxide.

6. The touch display device of claim 1, wherein a material of the first substrate comprises aluminum silicate.

7. The touch display device of claim 1, wherein the display panel further comprises a transistor layer disposed between the second substrate and the display medium layer.

8. The touch display device of claim 1, wherein the display medium layer comprises a liquid crystal layer, an organic light emitting diode element layer or an inorganic light emitting diode element layer.

* * * * *